(12) United States Patent
Van Der Tempel et al.

(10) Patent No.: US 8,294,882 B2
(45) Date of Patent: Oct. 23, 2012

(54) PHOTONIC MIXER AND USE THEREOF

(75) Inventors: Ward Van Der Tempel, Muizen (BE); Daniel Van Nieuwenhove, Hofstade (BE); Maarten Kuijk, Antwerp (BE)

(73) Assignee: Softkinetic Sensors NV, Brussels (BE)

( * ) Notice: Subject to any disclaimer, the term of this patent is extended or adjusted under 35 U.S.C. 154(b) by 239 days.

(21) Appl. No.: 12/904,204

(22) Filed: Oct. 14, 2010

(65) Prior Publication Data

US 2011/0255071 A1 Oct. 20, 2011

(30) Foreign Application Priority Data

Oct. 14, 2009 (GB) .................................. 0918040.7
Nov. 27, 2009 (GB) .................................. 0920866.1
Dec. 21, 2009 (GB) .................................. 0922319.9

(51) Int. Cl.
    *G01C 3/08* (2006.01)
(52) U.S. Cl. ........................ 356/5.01; 356/5.1
(58) Field of Classification Search ........ 356/3.01–3.15, 356/4.01–4.1, 5.01–5.15, 6–22, 28, 28.5, 356/139.01–139.1
See application file for complete search history.

(56) References Cited

U.S. PATENT DOCUMENTS

| | | | |
|---|---|---|---|
| 6,157,035 A | 12/2000 | Kuijk et al. | |
| 6,777,659 B1 | 8/2004 | Schwarte | |
| 6,825,455 B1 | 11/2004 | Schwarte | |
| 2005/0051730 A1* | 3/2005 | Kuijk et al. | 250/370.01 |

FOREIGN PATENT DOCUMENTS

| | | |
|---|---|---|
| EP | 1513202 A1 | 3/2005 |
| EP | 2081004 A1 | 7/2009 |
| WO | 98/10255 A1 | 3/1998 |
| WO | 99/60629 A1 | 11/1999 |

OTHER PUBLICATIONS

Nieuwenhove et al., "Photonic Demodulator With Sensitivity Control", IEEE Sensors Journal, vol. 7, Mar. 2007, pp. 317-318, ISSN 1530-437X.
Examination report of the British Patent Office regarding British Patent Application No. GB 0918040.7, Apr. 20, 2010.
Examination report of the British Patent Office regarding British Patent Application No. GB 0918040.7, Feb. 25, 2010.

* cited by examiner

*Primary Examiner* — Luke Ratcliffe
(74) *Attorney, Agent, or Firm* — Bacon & Thomas, PLLC

(57) ABSTRACT

The photonic mixer comprises a couple of an injecting contact region (3, 4) for injecting the majority carrier current into the semiconductor substrate (1) and a detector region (7, 8) for collecting the photocurrent. The injecting contact region (3, 4) is doped with a dopant of the first conductivity type ($p^+$) at a higher dopant concentration than the semiconductor substrate (1). The detector region (7, 8) is doped with a dopant of a second conductivity type ($n^+$) opposite the first conductivity type and has a junction (11, 12) with the semiconductor substrate (1), a zone of the semiconductor substrate (1) around said junction (11, 12) being a depleted substrate zone (101, 102). The couple further comprises a field shaping zone (13, 14) of the first conductivity type ($p^-$) defining a lateral edge of the couple and having a dopant concentration higher than the dopant concentration of the semiconductor substrate (1), for example between the dopant concentrations of the semiconductor substrate (1) and the injecting contact region (3, 4), which field shaping zone (13, 14) is designed to limit said depleted substrate zone (101, 102) laterally.

19 Claims, 7 Drawing Sheets

PHOTONIC MIXER AND USE THEREOF

TECHNICAL FIELD OF THE INVENTION

The invention relates to a photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising:

- at least one injecting contact region of the first conductivity type for generating the majority carrier current and the associated electric field by injecting the majority carrier current into the semiconductor substrate, said contact region having a higher dopant concentration than the semiconductor substrate, and
- at least one detector region of a second conductivity type opposite to the first conductivity type for collecting the photocurrent, said detector region having a junction with the substrate, a substrate zone around said junction being a depleted substrate zone.

The invention further relates to use of such a photonic mixer.

BACKGROUND OF THE INVENTION

Such a photonic mixer is known from EP-A 1513202. Such a photonic mixer is for instance intended for "time of flight" (TOF) range-finding applications. Prior art documents WO98/10255 and WO99/60629 explain the general principle of time of flight measurements for range finding applications. A light source is modulated at a frequency in the range of 1 MHz to 1 GHz. The light illuminates an object, scene and part of the reflected light enters the range finder camera through a focused lens. By measuring in each pixel the phase of the incident light, a distance can be estimated between the pixel and its conjugate (light-reflecting) pixel area in the scene. In this way the distances of objects and shape of objects can be estimated and recorded.

The photonic mixer is a device for measuring the phase of the reflected light accurately. This phase accuracy is very important, since it is linked to the precision of estimating the distance. The photonic mixer mixes the incident light right away in the detector, instead of in a connected electronic mixer. Therewith, low noise is achieved, and thus a better signal to noise ratio and a smaller error on the estimated distance. Particularly relevant in the operation of the photonic mixer is that the electric signal is applied to the substrate with the same modulation frequency as the electromagnetic radiation. In this manner, the mixing of the signal occurs directly in the substrate. In traditional photodetectors, the mixing is carried out at a later stage in a separate mixer.

FIG. 6A illustrates an embodiment of the prior art photonic mixer, that mixes incident amplitude modulated electromagnetic radiation with an electrical signal applied to the substrate 1—typically an epi-layer thereof—through source 90. FIG. 6B shows a cross-section through line III-III' of the device illustrated in FIG. 6A. The electrical signal applied by source 90 generates a majority current, e.g. majority hole current 99, through the substrate 1. The applied electrical signal is typically modulated with the same frequency as the electromagnetic radiation, typically light. When photons from the electromagnetic radiation impinging on the field area of substrate enter the field in the substrate, these are converted into pairs of electrons and holes. Minority carriers, like electrons in a p-substrate 1 will feel the electric field that is associated with the applied majority hole current 99, and will drift towards a first source of majority carriers, e.g. holes, which is in the example illustrated p+-contact region 61. They will then diffuse into an adjacent first detector region comprising a well or collector region 67 and a contact region 63. In this manner, they will become part of an output photocurrent of the left mixer connection point Mix1. A possible electron trajectory is trajectory 66, as illustrated in FIG. 6B. When the applied voltage or electrical signal is inverted as illustrated in FIG. 6C, the direction of the majority current flow is inverted, and the minority carriers drift towards the complementary contact region, p+-finger 62. Thereafter, most of the minority carriers, namely electrons, diffuse into the second detector region 64 via n-well 68, becoming part of an output photocurrent of the right mixer connection point MIX2. A possible electron trajectory is trajectory 69, as shown in FIG. 6C. In this way, the field area sensitive to incident photons becomes large, whilst the detector regions 63, 64 have only a small capacitance due to their limited finger areas. Electromagnetic masking such as metal regions 60 can be used to prevent that the impinging electromagnetic radiation, such as light penetrates in unwanted areas.

It has been observed in experiments with the prior art photonic mixer that the obtained modulation frequency was clearly less than the theoretically calculated maximum. This has the disadvantage that the bandwidth of the photonic mixer is limited. The bandwidth limitation not merely limits overall speed of the device, but also imposes a limit to its precision.

It is therefore an object of the invention to provide a photonic mixer of the kind mentioned in the opening paragraph that is suitable for use at increased modulation frequencies, such as above 10 MHz, more specifically above 100 MHz.

SUMMARY OF THE INVENTION

This object is achieved as claimed in claim 1, in that the injecting contact region and the detection region form a couple, which couple further comprises a field shaping zone of the first conductivity type defining a lateral edge of the couple and having a dopant concentration higher than the dopant concentration of the semiconductor substrate, for example between the dopant concentrations of the semiconductor substrate and the injecting contact region, which field shaping zone is designed to limit said depleted substrate zone laterally.

It has been found that the provision of these zones leads to an increase in the modulation frequency. It is believed that the provision of the zones results therein that the field extends deeper into the substrate. It is has been found relevant that the detection region forms a pn-junction with the substrate, e.g. that the at least one field shaping zone is not present below the detector region. Such undesired presence would hamper the diffusion of minority charge carriers, typically electrons, to the detector region.

The limiting of the depleted substrate zone laterally may occur in that the field shaping zone delimits the depleted substrate zone. Alternatively, the limiting may occur electrically, i.e. in that the field extending through the field shaping zone limits the extension of the depleted substrate zone. In a further alternative, the limiting may occur geometrically, i.e. in that the junction has a planar or parabolic or similar shape and the depleted substrate zone conforms thereto. Clearly, a combination of these limiting effects may occur as well. A design such that the junction has a parabolic shape, in a cross-sectional view, is deemed to be highly beneficial.

In one embodiment of the invention, the detector region comprises detector contact region and a detector collector region sharing a mutual interface, which detector collector region is doped at a lower concentration than the detector contact region and is delimited by the junction with the substrate. The provision of a detector collector region results in that the junction has a larger interfacial area and that the junction is present at a deeper level in the substrate. Both effects support an effective collection of the photocurrent. The depth at which the junction is present may be smaller, equal to, or larger than the depth to which the field shaping zone extends. Suitably, the junction is present at approximately the same depth as that to which the field shaping regions extend.

The detector zone may form a pn-junction with the at least one field shaping zones around it. However, this is not necessary and lightly doped substrate (typically p−−) could be present between the detector zone (typically n−) and the at least one field shaping zone (typically p−).

In one embodiment, the field area is laterally delimited by at least one contact. This contact is preferably a contact region defined in the semiconductor substrate and doped with a dopant of the first conductivity type. More suitably, the dopant concentration is identical to that of the injecting contact region. Optionally, this contact region may have an interface with an additional field shaping zone. This field shaping region preferably laterally delimits the field area. It is observed that the at least one contact may have a ring-shape, but alternatively, could be U-shaped, L-shaped and could further be composed of more than one contact, such as a first and a second U shaped contact, or a first and a second rectangular contact. When the contact has a limited extension, any field shaping region preferably would be ring-shaped Instead of a contact region, the contact may be a metal contact on top the semiconductor substrate or a contact within a trench in the semiconductor substrate.

In another embodiment, the semiconductor substrate comprises an active layer with a first side and an opposed second side, wherein said detector region and said injecting correct region are located at the first side and a contact for collecting the majority carrier current is located at the opposed second side of the active layer. Whereas the extension of the field in the previous embodiment was primarily lateral, this embodiment has a field that is primarily vertically oriented, e.g. perpendicular to the first side of the active layer. The embodiments will hereinafter also be referred to as those with a lateral contact and with a vertical contact. A further option is that there is both a lateral contact and a vertical contact are present.

The vertical contact is present at the second side of the active layer. There are several options for the implementation thereof, e.g. the contact may be a metal contact on the second side of the semiconductor substrate, in which case the active layer constitutes the body of the substrate. The metal contact may cover the complete second side, but that is not deemed necessary. The metal contact could also be present in a cavity etched in the semiconductor substrate from the second side. The vertical contact may alternatively be a buried region of the first conductivity type. This region may be coupled with a plug or other vertical connection to the first side of the active layer, e.g. the main surface of the semiconductor substrate. The vertical contact may in again another version be a top interface of a conductive (e.g. doped) substrate layer, for instance a p+ substrate. More specific implementations hereof will be apparent to the skilled person in the art.

The advantage of the vertical contact is a higher resolution, which may be easily a factor of 10. The higher resolution may be used to provide more individual mixers per unit surface area, or to reduce the size of the photonic mixer.

In a most relevant embodiment, the photonic mixer is a differential photonic mixer. Thereto, at least two couples of a current injecting contact region and at least one detector region are present within said field area. The advantage of a differential photonic mixer over a photonic mixer with merely one couple, i.e. a single ended photonic mixer, is the reduction of measurement time. In even further embodiments three or more of such couples may be present within the field area. A third couple allows further tuning of the frequency range. The presence of four couples is advantageous in order to reduce measurement time. Herewith, localizing an object in three dimensions can be carried out within a single measurement. With two couples, localizing an object in three dimensions requires two measurements. The four couples are preferably activated in pairs, i.e. as a differential photonic mixer. Individual actuation is however not excluded.

Suitably, either a vertical contact or a lateral contact or both are present. This embodiment allows to generate a field with both a DC and an AC component. The AC component is generated in that the majority carrier current is alternatingly injected from the contact regions of the couples. Suitably, thereto, these contact regions are provided at a different voltage, particularly an opposite voltage around a reference level. The reference level is typically ground (0V), but that it may have another value.

The device with a first and a second couple and a contact—either a lateral contact or a vertical contact—is found to be very advantageous. It has been found that the demodulation efficiency has increased with 10-20%. This demodulation efficiency defines the efficiency at which charges are separated in the photonic mixer and is hence a measure for the influence of the electric field on the charge carriers forming the photocurrent. This increase is substantial, as it gives rise to threefold improvements in the speed of the measurement system. In addition of being simply better, it is an additional advantage that the number of light emitters in the system may be reduced. Particularly, with a twofold increase in speed, the number of light emitters can be reduced fourfold.

The contact region laterally limiting is put at a voltage that does not oscillate, but has a constant value during the photonic mixing operation. It thus provides the DC component. The voltage of this laterally limiting contact region is preferably such that the photocurrent is directed to the center of the field. The laterally limiting contact region is not a current injecting contact region, when used for providing a counterelectrode at a specified DC voltage level. A field shaping region may be present below this contact region, but that is not deemed necessary.

The vertical contact or the lateral contact is preferably operated as a shutter. Thereto, the voltage on the contacts is varied to shut down the DC component of the field, and therewith to ensure that minority carriers will not be attracted by the contact regions. Instead of applying the shutter function on the lateral contact or the vertical contact, it may be further implemented through the injecting contact region of the couple, particularly in case that more than one couple is present.

In a preferred version of this embodiment, each of said couples has a substantially rectangular shape, when seen in top view, with an edge, a length and a width defining a length/width ratio between 0.05 and 20, said edge being formed by the at least one field shaping zone. Most suitably, the design is such that wherein the rectangular shaped couple is provided with a centre, at which a contact region with an underlying field shaping region is present, one ring-shaped or a plurality of detector regions being present on opposed sides of said contact region within said edge. The resulting design turns out advantageous. The term 'substantially rectangular' includes the specific implementation of a rectangular shape with trimmed corners. Preferably, the injecting current region and the detector region have an elongated shape, or have portions with elongated shape. Therewith, the effective area is increased, leading to improved performance.

In a second aspect, the invention provides a photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite to the first conductivity type and that has a junction with the semiconductor substrate, a zone of the semiconductor substrate around said junction being a depleted substrate zone, wherein the detector region is ring shaped and extends around the injecting contact region, a field shaping zone of the first conductivity type with a dopant concentration higher than that of the semiconductor substrate extending laterally around the detector region.

In a third aspect, the invention provides a photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite the first conductivity type and has a junction with the semiconductor substrate, a zone of the semiconductor substrate around said junction being a depleted substrate zone,
wherein the semiconductor substrate comprises an active layer with a first side and an opposed second side, wherein said detector region and said injecting correct region are located at the first side and a contact for collecting the majority carrier current is located at the opposed second side of the active layer.

The second and third aspect of the invention may be combined with any more specific implementations and embodiments as discussed with respect to the first aspect and as discussed in the figure description.

In a further aspect, the invention relates to a system for measurement of distances between a first and a second object, in particular for a time of flight (TOF) application. This system comprises at least one emitter emitting modulated electromagnetic radiation at a first modulation frequency. It further comprises a photonic mixer for detecting said emitted and optionally reflected modulated electromagnetic radiation and in situ mixing a resulting photocurrent with an applied oscillating signal, which oscillates at the modulation frequency, said photonic mixer providing an output signal representative of a phase of the detected radiation. Specifically, the photonic mixer according to the invention is present.

These and other aspects of the photonic mixer according to the invention will be further elucidated with reference to the Figures.

DESCRIPTION OF THE ILLUSTRATIVE EMBODIMENTS

Figure 1A:
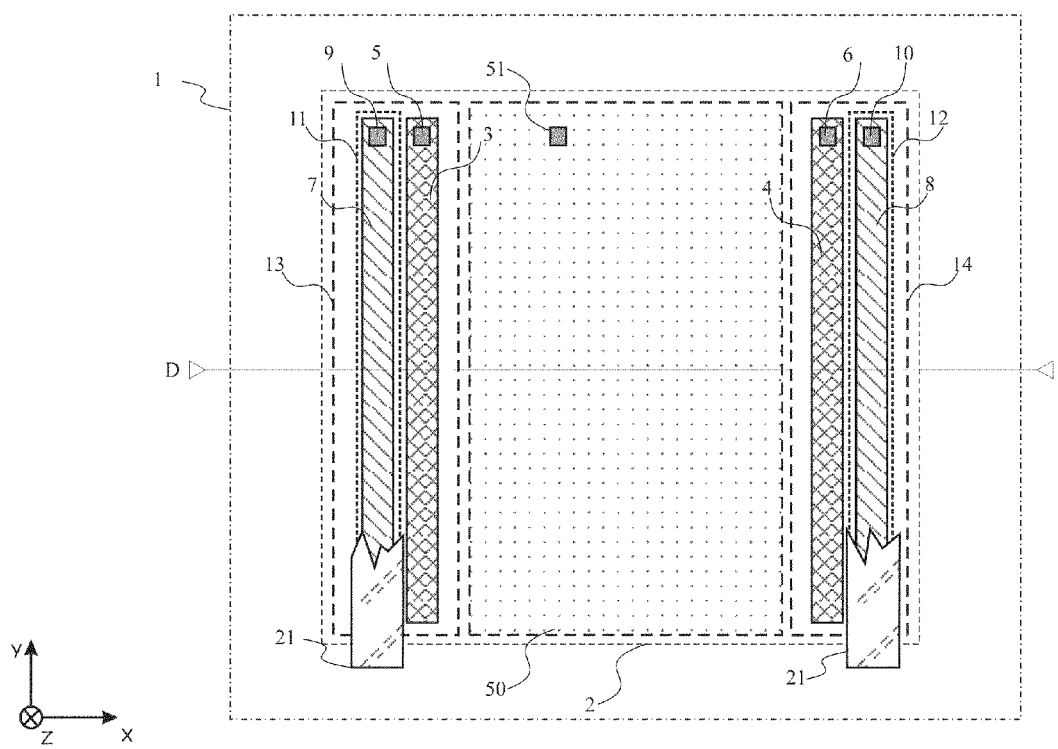
FIG. 1A is a diagrammatical top view of a first embodiment of the invention.

The figures of the present application are not drawn to scale and are merely intended for illustrative purposes. Equal reference numerals in different figures refer to like elements.

Figure 1B:
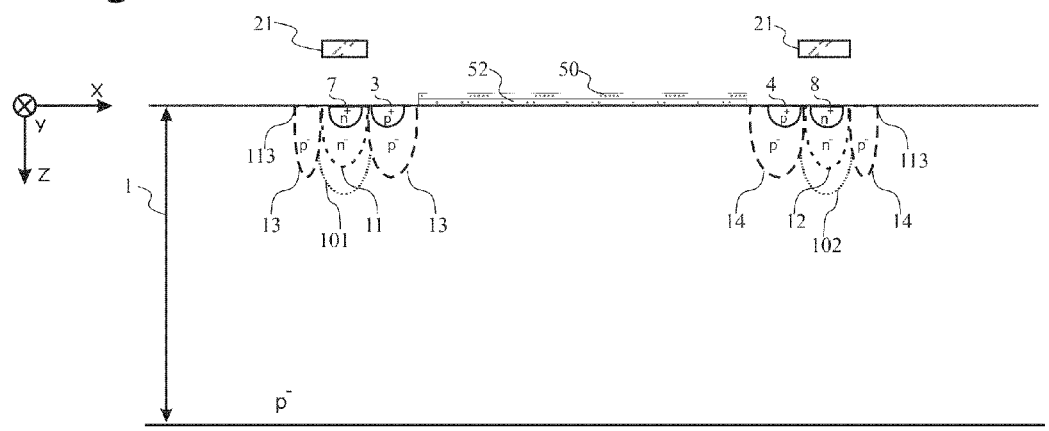
FIG. 1B is a diagrammatical cross-sectional view of the first embodiment as shown in FIG. 1A, taken along the line D in FIG. 1A

FIG. 1A is a diagrammatical top view of a first embodiment of the invention, and FIG. 1B. is a diagrammatical cross-sectional view of the first embodiment as shown in FIG. 1A, taken along the line D in FIG. 1A. The photonic mixer comprises a semiconductor substrate 1. The semiconductor substrate 1 comprises for instance a bulk silicon substrate that is p-type-doped. It may comprise alternatively another carrier, including glass, sapphire. The substrate may further be a SOI-type substrate with a buried insulating layer. The shown portion of the semiconductor substrate 1 is in this example a lowly doped epitaxially grown silicon layer (epi-layer) such as typically applied for the definition of semiconductor devices. In this example, use is made of a p-type substrate, and the epi-layer is $p^{--}$-doped, as known per se to the skilled person. It suitably has a thickness between 10 and 50 microns. The semiconductor substrate 1 may contain another material than Si, such as SiGe, SiC, GaN, GaAs, InP.

Contact regions 3, 4 and detector regions 7,8 are formed by implantation of dopant atoms into the substrate, in a manner known per se. The contact regions 3,4 are $p^+$ or $p^{++}$ doped. The detector regions 7,8 comprise, in this example, detector contact regions ($n^+$) and detector collector regions ($n^-$), which share a mutual interface. The detector regions 7,8 are doped with a dopant of the second conductivity type opposite to the first conductivity type, e.g. n-type doped. The dopant concentration of the detector contact regions ($n^+$) is higher than that of the detector collector regions ($n^-$). The detector regions 7,8—in this example the detector collector regions thereof—have an interface with the substrate 1, which is a junction, i.e. a pn-junction. In operation, the pn-junction is typically reversed biased. Depleted substrate zones 101, 102 are present around said junction 11, 12 in the substrate 1.

In accordance with the invention, field shaping zones 13, 14 are present. The field shaping zones 13, 14 are of the first conductivity type (p-type). They extend substantially perpendicularly into the semiconductor substrate 1. The field shaping zones 13, 14 have a dopant concentration ($p^-$) higher than the dopant concentration of the substrate 1 ($p^{--}$), for example between the dopant concentrations of the substrate 1 ($p^{--}$) and the injecting contact regions 3,4 ($p^+$). The at least one detector region 7,8 is located, when viewed in a top view, between a first and a second field shaping zones 13, 14, so as to limit laterally said depleted substrate zone 101, 102. The field shaping regions 13, 14 extend into the substrate 1 to a depth of for instance 0.5-5 microns, preferably 1-2 microns. The field shaping zones 13, 14 of the first conductivity type define a lateral edge 113 of a couple of an injecting contact region 3,4 and a detection region 7,8.

Without said field shaping zones 13, 14, the depleted substrate zones 101, 102 would extend much more widely, particularly as a sphere extending up to the substrate surface. It would moreover have an asymmetrical shape; the presence of the contact region 3,4 would set a limit on one side, but not on the other.

With the field shaping zones 13, 14, the junction 11, 12 has in cross-sectional view as shown in FIG. 1B, a parabolic shape. The depleted regions 101, 102 are effectively shells around this junctions 11, 12. Hence they extend more perpendicularly to the substrate surface (also referred to as vertical) than lateral. This is also the case, when the detector region 7,8 extends deeper into the substrate 1 than the field shaping regions 13, 14.

When the detector regions 7,8 are limited to the contact regions ($n^+$), the shape of the junction is not parabolic or something similar to that. However, the field shaping regions 13, 14 laterally limit the depleted regions directly in this case, e.g. to the substrate area between them.

In this embodiment, an optically transparent electrode 50 is present on a surface of the substrate 1. It is separated from the substrate surface by an insulating layer 52, such as an oxide. However, high-K dielectrics such as tantalumoxide and other materials could be used alternatively. The optically transparent electrode 50 is suitably a layer of polysilicon. This may be doped in order to increase the conductivity with a suitable dopant. The electrode 50 may be applied to reduce surface recombination by applying a repulsive force on the electrons. Suitably, in operation, a voltage is applied on this electrode 50 in order to enhance the repulsive force. Thereto, a terminal 51 is present. The electrode 50 is patterned so as not to overlie the detector regions 7,8, the contact regions 3,4 and the field shaping zones 13, 14. It does not need to cover the complete field area 2.

The top view of FIG. 1A shows the layout of this first embodiment. The field shaping zones 13, 14 are at opposite edges of the field area 2, at which electromagnetic radiation will impinge the substrate so as to be converted into minority and majority carriers. The detector regions 7,8 and the contact regions 3,4 are elongate regions extending parallel to each other and are provided with terminals 9,10 and 5,6 respectively. These terminals 9, 10, 5, 6 are in this example limited to areas at an end of the regions 7, 8, 3, 4 but they not need to be located exactly there. There can be multiple terminals on the same contact region. Masks 21 overlie the detector regions 7,8 in order to shield those from incoming electromagnetic radiation.

Figure 2:
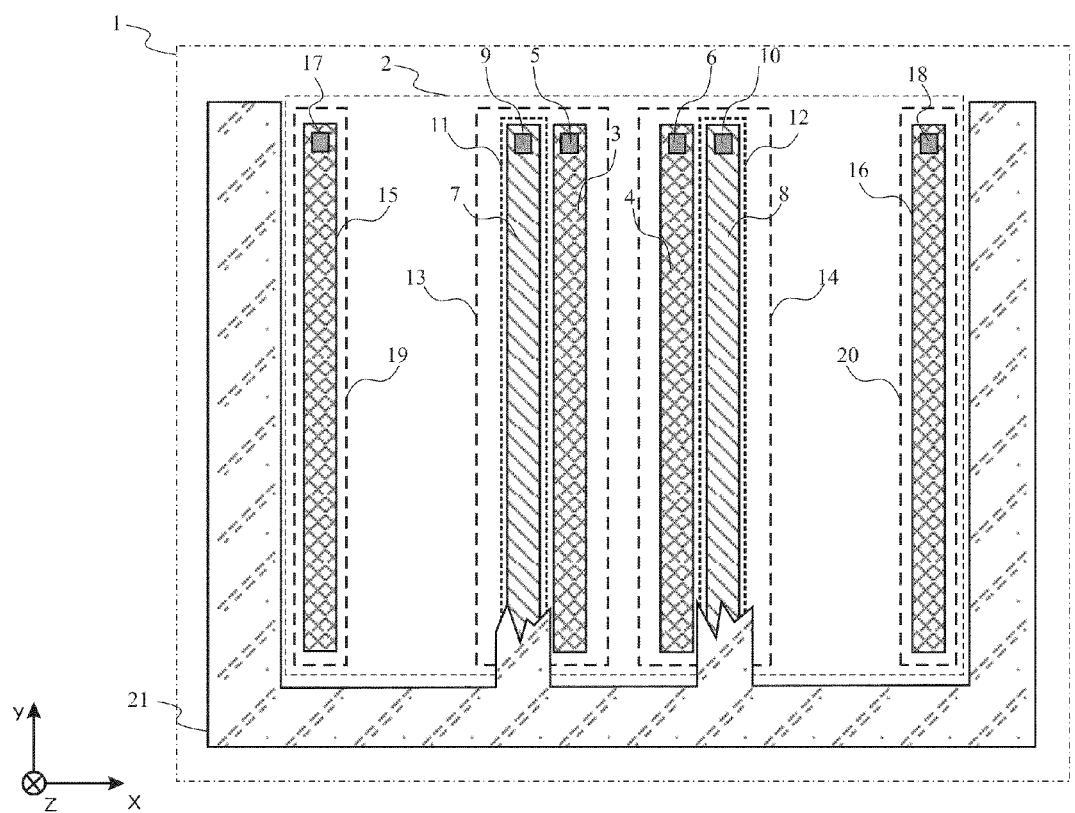
FIG. 2 is a diagrammatical top view of a second embodiment of the invention.

FIG. 2 is a diagrammatical top view of a second embodiment of the invention. Whereas in FIG. 1A, two pairs of a detector region and a contact region are defined at extremes of the field area 2, this embodiment comprises four contact regions 3, 4, 15, 16 and merely two detector regions 7,8. The additional contact regions 15,16 are located at extreme edges of the field area 2. Field shaping zones 19, 20 are defined below the additional contact regions 15, 16 and terminals 17, 18 are defined thereon. The additional contact regions 15,16 are designed to be put on a constant voltage during the photonic mixing operation. The contact regions 3,4 are intended to be put on alternating voltages. Therewith, one may apply a field with both a AC component and a DC component. The application of such field is found to limit crosstalk.

It is an option of the present embodiment to leave out one of the detector regions 7,8. That is beneficial so as to reduce detector area for smaller devices. This option is not limited to the presently shown layout, but is effectively an option for any of the embodiments having a first and a second couple of both detector region and contact region in combination with laterally remote contact regions acting as a DC counterelectrode. However, leaving out one detector region may have a substantially negative impact on the overall collected photocurrent, and hence the efficiency of the photonic mixer. In the example of FIG. 2, the detector is elongate, and the impact is expected to be small.

Another consequence of removal of the second detector region is that the number of measurements to be carried out sequentially may increase. Measurement of at least three different phases is required in order to obtain a distance measurement of an object in a time of flight method. With one detector region, there is merely one output, and thus three sequential measurements are needed. With two detector regions, two sequential measurements are sufficient. With four detector regions, one sequential measurement appears sufficient.

It is another option of the present embodiment to leave out the field shaping zones 19, 20 below the additional contact regions 15, 16 at the edges of the field area 2. As there is no junction and no depleted substrate zone in the direct neighbourhood of these additional contact regions 15, 16, the relevance is less big. However applying such field shaping zones 19, 20 appears to be advantageous for the shape of the electric field, particularly for creating a symmetric field.

Figure 3A:
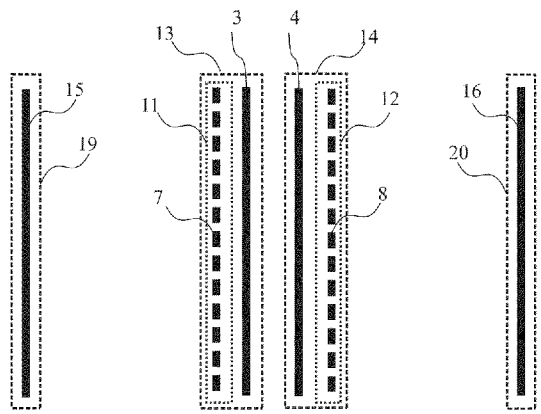
FIG. 3A-3F shows diagrammatical representations of layouts to be used in conjunction with the first and second embodiment.
Figure 3D:
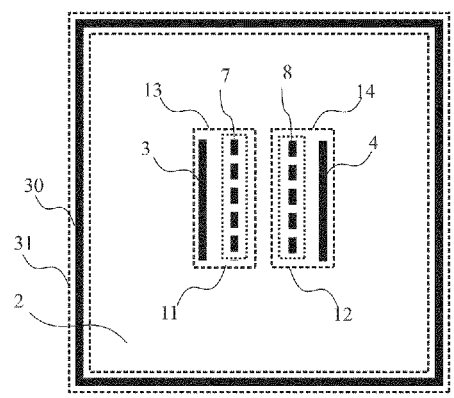
Figure 3B:
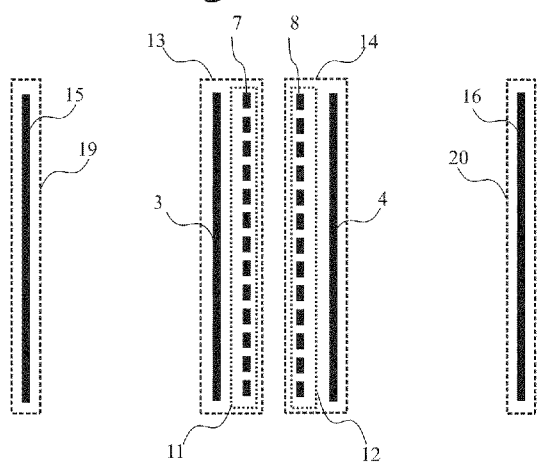

FIG. 3A-3F and FIG. 4A-4F show in total twelve designs for use in the invention, in simplified diagrammatical top-views. FIG. 3B shows a simplified diagrammatical topview representation of the photonic mixer represented in FIG. 2, whereby only the necessary subset of elements is represented. The thick solid lines represent the contact regions of the first conductivity type, $p^+$-regions 3, 4, 15, 16 for applying the majority current. The thick dashed line represents the detection regions 7,8. The dotted line represents the junction interface 11, 12 of the detector collector regions with the surrounding regions. The dashed lines around the thick solid lines represent the outside of the field shaping zones 13, 14, 19, 20.

FIG. 3A is a design largely corresponding to the design of FIG. 3B. The difference relates to the positioning of the detector region and contact regions within the field shaping zones. In the design of FIG. 3A, the detector regions 7,8 are defined between the contact regions 3,4 and the additional contact regions 15, 16 at the edges of the field area 2. In the design of FIG. 3B, the contact regions 3,4 are defined between the detector regions 7,8 and the additional contact regions 15, 16 at the edges of the field area 2. The set up of FIG. 3A tends to enhance the speed of the diffusion process in which the minority charge carriers diffuse to the detector regions 7,8 to make up the photocurrent.

Figure 3E:
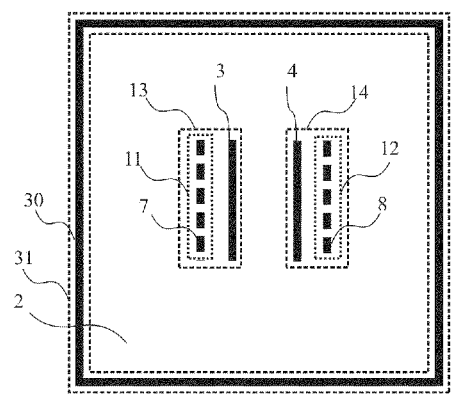
Figure 3C:
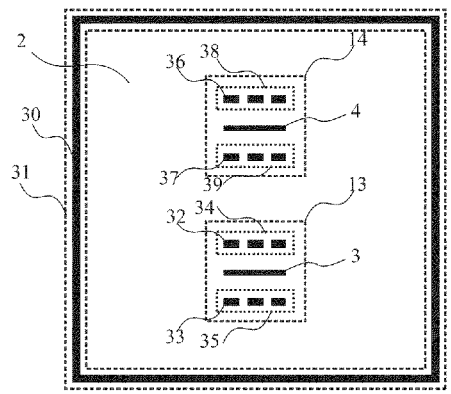
Figure 3F:
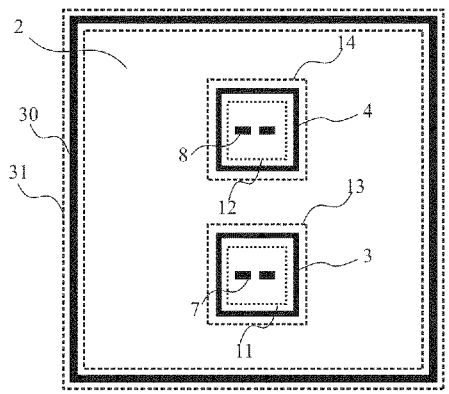
Figure 4A:
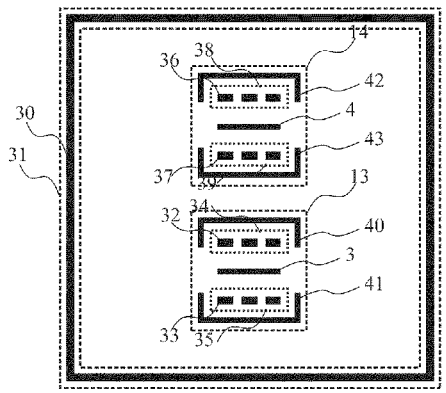
FIG. 4A-F shows diagrammatical representations of another six layouts.
Figure 4D:
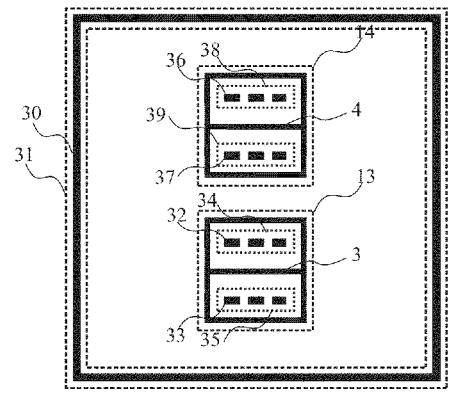
Figure 4B:
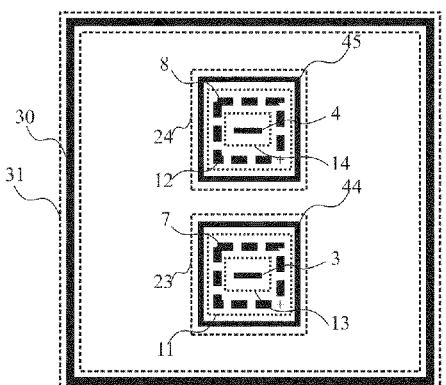
Figure 4E:
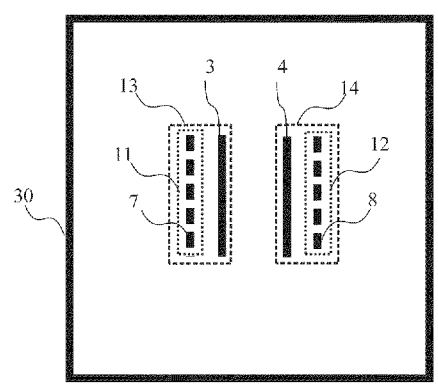
Figure 4C:
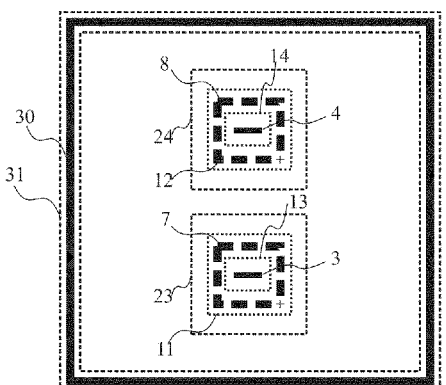
Figure 4F:
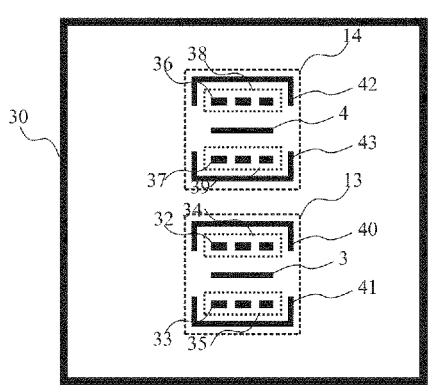

FIGS. 3C-3F and FIGS. 4A-4F show designs comprising a ring-shaped additional contact region 30 at the edge of the field area 2. The advantage of the designs here is that the field is oriented to the center instead of between a first and a second elongated and parallel contact regions. Such center-oriented field is deemed to be beneficial for further increasing the modulation frequency. The additional contact region 30 is present within a field shaping zone 31. FIGS. 4E and 4F are identical to those of FIG. 3E and FIG. 4A respectively, except that the field shaping zone below the ring shaped contact region at the edge of the field area 2 has been left out. The contact regions and detector regions are present in couples having a rectangular shape defined by the field shaping zone.

A first group of the designs is shown in FIG. 3C, FIG. 4A and FIG. 4D. These designs comprise couples of at least one contact region 3, 4 and two detector regions 32, 33 and 36, 37. The edge of the couple is defined by the field shaping zone 13, 14. Windows 34, 35 and 38, 39 are present within the single field shaping zone 13, 14 around the detector regions 32,33 and 36,37. A contact region 3, 4 is present between a first and a second detector region. The contact region 3,4 and detector regions 32, 33, 36, 37 are all of elongated shape, or comprise elongated portions. In this example, the orientation of the couples is identical, and more specifically such that a detector regions 32, 33, 36, 37 in the two couples are oriented in parallel and in a single row, with their long sides towards each other. This is however not deemed necessary. The orientation of all of them may be such that the detector regions 32, 33, 36, 37 in the two couples are present in two rows of two, with their short sides towards each other. The one couple may be shifted towards the other. The two couples may also be located on a diagonal. The orientation of the two couples may include an angle of anything between −90 and +90 degrees. Preferably, however, the design is such that the contact regions 3, 4 in the couples are oriented in parallel to a portion of the ring-shaped contact region 30 at the edge of the field area 2. It is moreover preferred that the couples are present with their centres on a middle line or a diagonal line of the field area 2. Such orientation leads to most regular, preferably symmetric set up of the electric field, and hence with a field that is least disturbed.

In comparison with FIG. 3C, FIG. 4A comprises two additional contact regions 40, 41 and 42, 43 per couple. The additional contact regions 40-43 are defined between the detector regions 32, 33, 36, 37 and the edge of the couple 13, 14. While the shown U-shape is preferred, a rectangular shape or an L-shape is not excluded. In comparison with FIG. 4A, the design of FIG. 4D has even more contact regions. In this design, the three contact regions per couple 3, 41, 42 and 4, 43, 44 shown in FIG. 4A are merged into a 8-shaped contact region 3,4. This is beneficial for the distribution of the field.

A second subset of designs is constituted by FIGS. 3F, 4B and 4C. Herein, the couple is built up as a series of rings. FIG. 3F shows a design wherein the detector 7,8 is present at the heart of the couple. A ring-shaped contact region 3,4 circumvents the detector 7,8. FIG. 4B shows a design with an inner contact region 3,4 within a first field shaping zone 13, 14, a ring shaped detector region 7,8 and ring shaped contact region 44, 45 within a second field shaping zone 23, 24. FIG. 4C shows a similar design, in which the outer ring-shaped contact region is absent, leaving the second field shaping region 23, 24 floating. The advantage of this type of designs is that the radial symmetry extends into each couple. This is believed to give rise to a very homogeneously distributed electric field. Optionally, the field shaping zones 13,14 extend deeper into the semiconductor substrate than the laterally limiting field shaping regions 23,24. This can be achieved, for example, by using an implantation type known to the skilled person as a Deep Pwell for field shaping zones 13,14. This deeper extension of the inner field shaping zones further improves the distribution of the electric field. Additionally, the deeper extension improves the quality of the contact region 3,4 with the substrate 1. Particularly, said quality is improved by preventing or at least reducing any negative impact resulting from a depletion of the typically n-type detector region 7,8.

The deeper extension is specifically advantageous for this second subset of designs, and most suitable in combination with a design in which the second field shaping region 23, 24 is left floating. However, the use of an implantation extending deeper into the substrate may also be applied to any of the other subsets. For instance, in the design shown in FIG. 4A, the deeper implantation could be present below contact region 4, e.g. In that case, there is a gradual transition from the deep well to the rest of the field shaping zone. The deep well is herein preferably applied locally at a centre of the couple.

A third subset of designs is constituted by FIGS. 3D and 3E. Herein, the elongate couples also shown in FIGS. 3A and 3B are located within the field area limited by a ring-shaped contact region.

Figure 7:
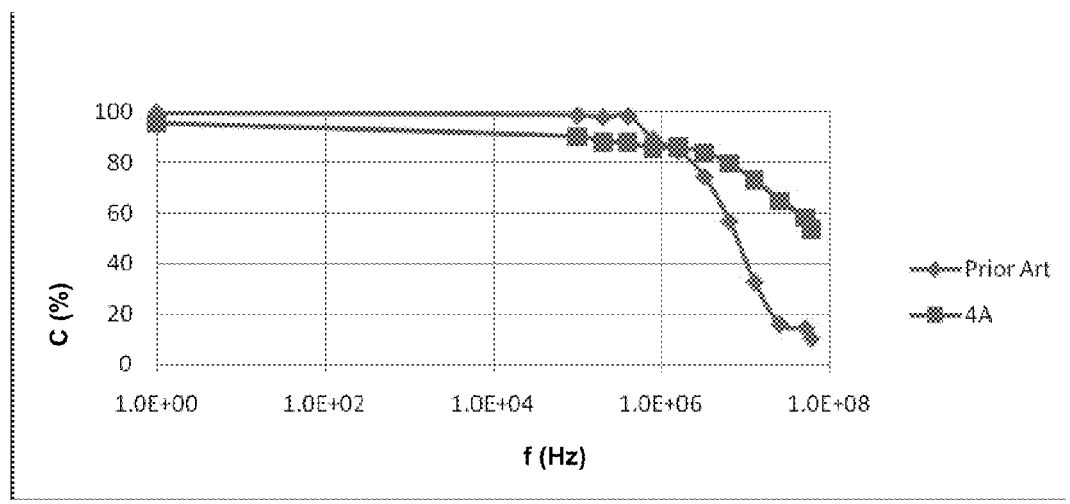
FIG. 7 is a graph showing the demodulation contrast as a function of the modulation frequency.

FIG. 7 is a graph showing the relationship between the modulation contrast C and the modulation frequency f for a prior art photonic mixer and an embodiment of the photonic mixer according to the invention. The photonic mixer used to generate the experimental data had the design as shown in FIG. 4A. The modulation contrast or modulation efficiency defines the efficiency at which charges are separated in the photonic mixer and is hence a measure for the influence of the electric field on the charge carriers forming the photocurrent.

The modulation contrast for the prior art photonic mixer reduces substantially already below 1 MHz. At 1 MHz it is approximately 85%. At 10 MHz, it has reduced to approximately 40%. At 100 MHz, the contrast is less than 20%. Such low contrast leads a considerable disadvantage. The modulation contrast for the photonic mixer according to the invention reduces slowly. At 5 MHz, it is still 80%. Around 50 MHz, the contrast is 60%, and at 100 MHz, the contrast is still 50%. These are contrasts that are sufficiently good to do an appropriate distance measurement. The increase in contrast at higher modulation frequencies leads to substantial increases in the speed of the measurement system. In addition of being simply better, it is an additional advantage that the number of light emitters in the system may be reduced. Particularly, with a twofold increase in speed, the number of light emitters can be reduced fourfold.

Figure 5A:
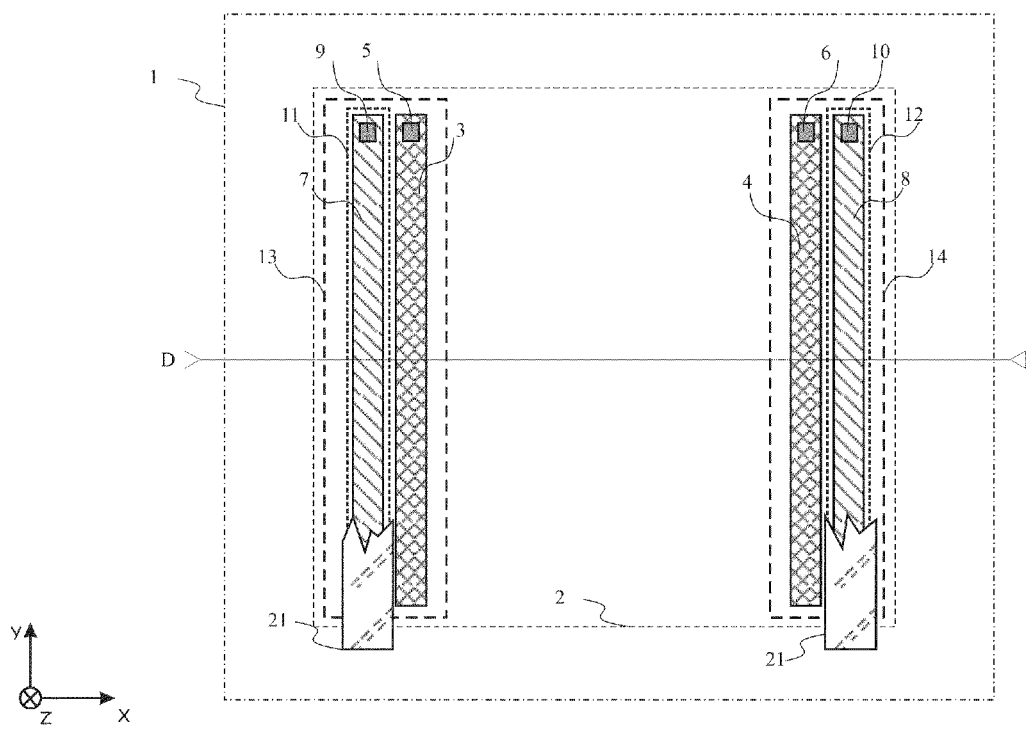
FIG. 5A is a diagrammatical representation of a third embodiment of the invention.
Figure 5B:
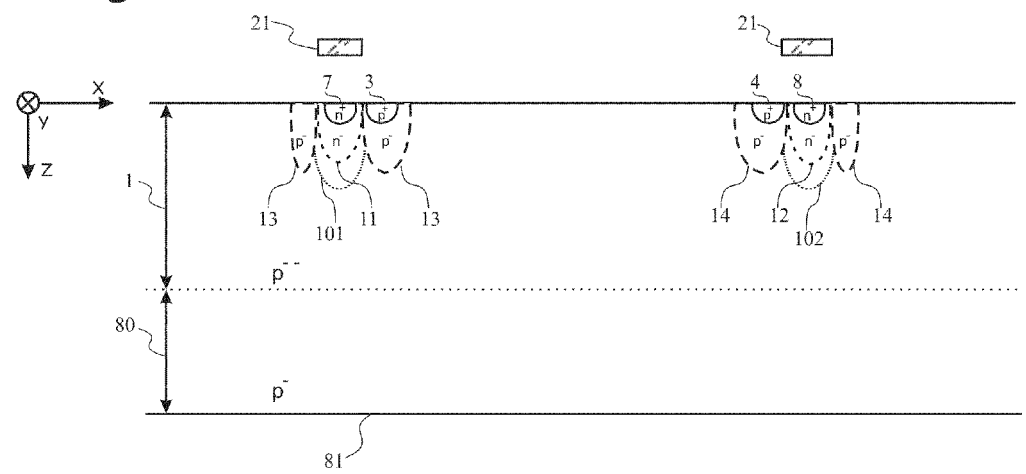
FIG. 5B is a diagrammatical cross-sectional view of the third embodiment.
Figure 6A:
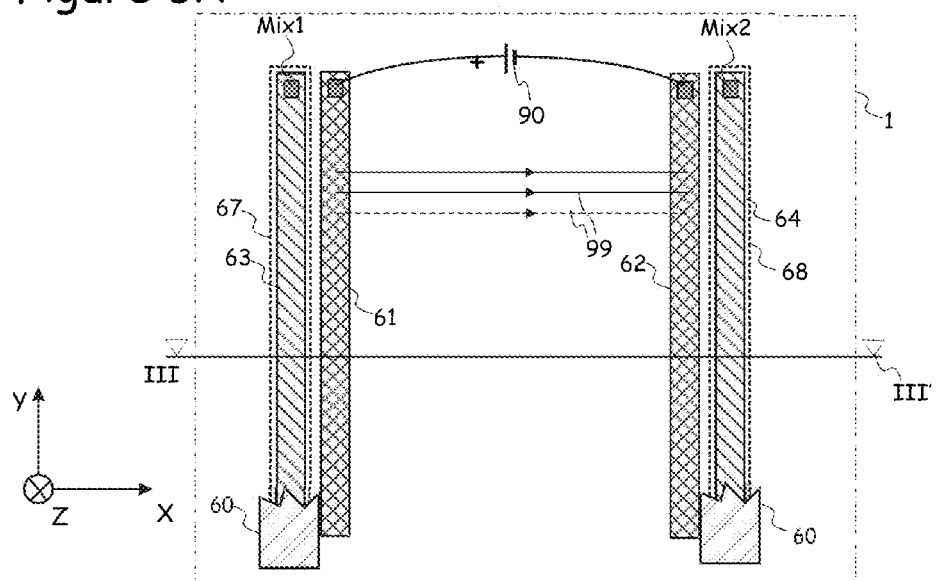
FIG. 6A is a diagrammatical representation of a top view of a prior art photonic mixer.
Figure 6B:
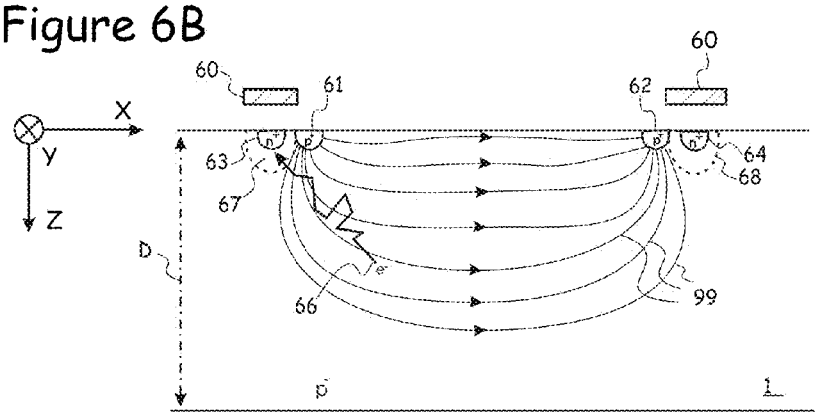
FIGS. 6B and 6C are diagrammatical cross-sectional views of the prior artphotonic mixer as shown in FIG. 6A, said cross-section being taken along the line III-III' in FIG. 6A.
Figure 6C:
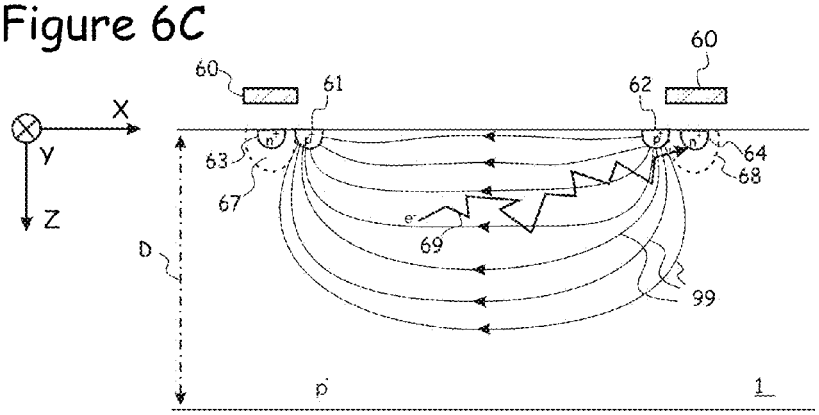

FIG. 5A is a diagrammatical top view of a third embodiment of the invention, and FIG. 5B. is a diagrammatical cross-sectional view of the third embodiment as shown in FIG. 5A, taken along the line D in FIG. 5A. FIG. 5 shows a substrate with an active layer 1 with p⁻doping and a bottom substrate layer 80 with in this example p⁻doping. Alternatively, the bottom substrate layer 80 may have a higher doping, such as p⁺ to be electrically conductive. Such substrates are commercially available and known to the skilled person. The exact doping level is a matter of implementation. Those skilled in the art will recognize that the bottom substrate layer 80 is a typical monocrystalline p-doped silicon substrate and the active layer 1 is an epi-layer. The bottom contact is effectively constituted by the bottom substrate layer 80 plus a metal contact 81 thereon. It is thus a vertical contact, as discussed in the introduction. The field will be extending between the injecting contact regions 3,4 and ultimately the metal contact 81. In view of the enhanced conductivity of the bottom substrate layer 80, the field effectively extends between the injecting contact regions 3,4 and the top of the bottom substrate layer 80. Typically, current is injected through the contact regions 3,4 into the active layer 1 at a modulation frequency, alternating between the first contact region 3 and the second region 4. These injecting contact regions 3,4 are present within couples of which a lateral edge is defined by the field shaping regions 13, 14.

In connection, with the invention as described before, the following options are mentioned: read out circuits and control circuits are suitably monolithically integrated, i.e. transistors and/or other semiconductor components are defined in the (active layer) of the semiconductor substrate, and interconnect structure is provided to define the desired circuit topology. Control of the photonic mixer not merely relates to the provision of the voltages to the contact regions, but also includes the provision of signals so as to reset the photonic mixer, particularly before a subsequent measurement. Such signal provision is typically achieved with a shutter function, as explained above. The electromagnetic radiation may be provided to the front side of the substrate, but alternatively also to the backside of the substrate, particularly in combination with reduction of substrate thickness and optionally application of a carrier to the front side. More than two couples may be present within the field area. Terms vertical, above and below are defined with reference to the orientation of a semiconductor substrate during processing, in which the front side is at the top (above) and the substrate surface defines the laterally extending direction. The vertical is then the normal to this substrate surface. Subdivision of one elongate contact region, detector region and also of the field shaping zones into several smaller regions/zones is not excluded.

The invention may be alternatively characterised in the following way: a photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising:

at least one injecting contact region of the first conductivity type for generating the majority carrier current and the associated electric field by injecting the majority carrier current into the semiconductor substrate, said contact region having a higher dopant concentration than the semiconductor substrate, at least one detector region of a second conductivity type opposite to the first conductivity type for collecting the photocurrent, said detector region having a junction with the substrate, a substrate zone around said junction being a depleted substrate zone at least one field shaping zone of the first conductivity type, said at least one zone extending substantially perpendicularly into the substrate and having a dopant concentration higher than the dopant concentration of the semiconductor substrate, for example between the dopant concentrations of the substrate and the contact region, the injecting contact regions having an interface with a field shaping zone, wherein said at least one detector region is located, when viewed in a top view, between a first and a second field shaping zones, or a first and second portion of a field shaping zone, so as to limit laterally said depleted substrate zone.

The invention claimed is:

1. A photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite to the first conductivity type and that has a junction with the semiconductor substrate, a zone of the semiconductor substrate around said junction being a depleted substrate zone, wherein said couple further comprises a field shaping zone of the first conductivity type defining a lateral edge of the couple and having a dopant concentration higher than the dopant concentrations of the semiconductor substrate, wherein the field shaping zone is designed to limit said depleted substrate zone laterally.

2. The photonic mixer as claimed in claim 1, wherein the detector region comprises a detector contact region and a detector collector region sharing a mutual interface, which detector collector region is doped at a lower concentration than the detector contact region and is delimited by the junction with the substrate.

3. The photonic mixer as claimed in claim 1, wherein the detector region is laterally surrounded by a single field shaping zone.

4. The photonic mixer as claimed in claim 1, wherein the field area is laterally delimited by at least one contact, which is preferably a contact region defined in the semiconductor substrate and doped with a dopant of the first conductivity type.

5. The photonic mixer as claimed in claim 1, wherein said couple has a substantially rectangular shape, when seen in top view, with, a length and a width defining a length/width ratio between 0.05 and 20 preferably between 0.25 and 4.

6. The photonic mixer as claimed in claim 1, wherein the couple is provided with a centre, at which a contact region with an underlying field shaping region is present, one ring-shaped or a plurality of detector regions being present on opposed sides of said contact region within said couple.

7. The photonic mixer as claimed in claim 1, wherein a photonic mixer is a differential photonic mixer, and a second couple is present within said field area in addition to the first couple, said second couple comprising an injecting contact region, a detector region having a junction to the semiconductor substrate and associated depleted substrate zone and a field shaping zone with corresponding dopant and dopant concentrations to those of the first couple and such that the field shaping zone laterally limits the depleted substrate zone.

8. The photonic mixer as claimed in claim 7, wherein a third and a fourth couple are present within said field area.

9. The photonic mixer as claimed in claim 1, wherein an optically transparent electrode is present on the field area for inducing a charge distribution in the field area so as to limit surface recombination.

10. The photonic mixer as claimed in claim 9, wherein the optically transparent electrode comprises a polysilicon layer.

11. The photonic mixer as claimed in claim 1, wherein the semiconductor substrate comprises an active layer with a first side and an opposed second side, wherein said detector region and said injecting contact region are located at the first side and a contact for collecting the majority carrier current is located at the opposed second side of the active layer.

12. The photonic mixer as claimed in claim 1, wherein the injecting contact region comprises an interface with a field shaping zone of the first conductivity type with a dopant concentration higher than the dopant concentration of the semiconductor substrate, this field shaping zone extending substantially deeper into the semiconductor substrate than a field shaping zone extending laterally around the detector region.

13. A photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite the first conductivity type and has a junction with the semiconductor substrate, a zone of the semiconductor substrate around said junction being a depleted substrate zone, wherein the detector region is ring shaped and extends around the injecting contact region, a field shaping zone of the first conductivity type with a dopant concentration higher than that of the semiconductor substrate extending laterally around the detector region.

14. The photonic mixer as claimed in claim 13, wherein the injecting contact region comprises an interface with a field shaping zone of the first conductivity type with a dopant concentration higher than the dopant concentration of the semiconductor substrate, which field shaping zone is designed to limit said depleted substrate zone laterally.

15. The photonic mixer as claimed in claim 13, wherein the injecting contact region comprises an interface with a field shaping zone of the first conductivity type with a dopant concentration higher than the dopant concentration of the semiconductor substrate, this field shaping zone extending substantially deeper into the semiconductor substrate than a field shaping zone extending laterally around the detector region.

16. The photonic mixer as claimed in claim 13, wherein the semiconductor substrate comprises an active layer with a first side and an opposed second side, wherein said detector region and said injecting contact region are located at the first side and a contact for collecting the majority carrier current is located at the opposed second side of the active layer.

17. A photonic mixer provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite the first conductivity type and has a junction with the semiconductor substrate, a zone of the semiconductor substrate around said junction being a depleted substrate zone, wherein the semiconductor substrate comprises an active layer with a first side and an opposed second side, wherein said detector region and said injecting contact region are located at the first side and a contact for collecting the majority carrier current is located at the opposed second side of the active layer.

18. Use of a photonic mixer according to claim 1 for time-of-flight range finding applications.

19. A system for measurement of a distance to an object, in particular for a time of flight (TOF) application, comprising:
   at least one emitter emitting modulated electromagnetic radiation at a modulation frequency;
   a photonic mixer for detecting said emitted and optionally reflected modulated electromagnetic radiation and in situ mixing a resulting photocurrent with an applied signal, which oscillates at the modulation frequency, said photonic mixer providing an output signal representative of a time delay of the detected radiation, wherein the photonic mixer is provided with a semiconductor substrate having a field area and means for generating a majority carrier current and an associated electric field in the semiconductor substrate that is doped with a first conductivity type, such that when electromagnetic radiation impinges on the substrate within said field area, pairs of majority and minority carriers are generated in the substrate, resulting in a photocurrent of the minority carriers, said substrate comprising a couple of an injecting contact region for injecting the majority carrier current into the semiconductor substrate and a detector region for collecting the photocurrent, which injecting contact region is doped with a dopant of the first conductivity type at a higher dopant concentration than the semiconductor substrate, and which detector region is doped with a dopant of a second conductivity type opposite to the first conductivity type and that has a junction with the semiconductor substrate, a zone of the semiconductor substrate around said junction being a depleted substrate zone, wherein said couple further comprises a field shaping zone of the first conductivity type defining a lateral edge of the couple and having a dopant concentration higher than the dopant concentrations of the semiconductor substrate, wherein the field shaping zone is designed to limit said depleted substrate zone laterally.

* * * * *